United States Patent
Kim

(10) Patent No.: US 11,749,371 B2
(45) Date of Patent: Sep. 5, 2023

(54) MEMORY SYSTEM INCLUDING MEMORY DEVICE PERFORMING TARGET REFRESH

(71) Applicant: SK hynix Inc., Gyeonggi-do (KR)

(72) Inventor: Woongrae Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 35 days.

(21) Appl. No.: 17/511,222

(22) Filed: Oct. 26, 2021

(65) Prior Publication Data

US 2022/0189573 A1 Jun. 16, 2022

Related U.S. Application Data

(60) Provisional application No. 63/125,053, filed on Dec. 14, 2020.

(30) Foreign Application Priority Data

Sep. 2, 2021 (KR) ........................ 10-2021-0116936

(51) Int. Cl.
*G11C 29/38* (2006.01)
*G11C 29/44* (2006.01)

(52) U.S. Cl.
CPC .......... *G11C 29/38* (2013.01); *G11C 29/4401* (2013.01)

(58) Field of Classification Search
None
See application file for complete search history.

(56) References Cited

U.S. PATENT DOCUMENTS

| | | | |
|---|---|---|---|
| 5,987,632 A | 11/1999 | Irrinki et al. | |
| 6,272,588 B1 * | 8/2001 | Johnston | G11C 29/50012 365/201 |
| 9,396,786 B2 | 7/2016 | Yoon et al. | |
| 9,858,982 B1 | 1/2018 | Kim et al. | |

(Continued)

FOREIGN PATENT DOCUMENTS

| KR | 10-2013-0115066 A | 10/2013 |
|---|---|---|
| KR | 10-2019-0121585 A | 10/2019 |

OTHER PUBLICATIONS

"Hou et al" A "built-in self-repair scheme for DRAMs with spare rows, columns, and bits"—(2016)—IEEE (Year: 2016).*

(Continued)

*Primary Examiner* — Cynthia Britt
*Assistant Examiner* — Matthew W Wahlin
(74) *Attorney, Agent, or Firm* — IP & T GROUP LLP

(57) ABSTRACT

A memory controller includes: a test module for generating a test command, a test address, and test data during a test operation; a refresh control module for receiving the test command and the test address as an active command and an active address, and generating a first target address by sampling the active address according to the active command, during the test operation; a command/address generation module for providing the active address together with the active command, and providing the first target refresh command together with the first target address to a memory device, while determining whether to repair the active address according to a repair control signal; and a repair analysis module for generating the repair control signal based on a comparison result of the test data and read data from the memory device, during the test operation.

23 Claims, 11 Drawing Sheets

(56) References Cited

U.S. PATENT DOCUMENTS

| | | | |
|---|---|---|---|
| 2008/0165599 A1* | 7/2008 | Gorman | G11C 29/16 365/201 |
| 2014/0006704 A1 | 1/2014 | Greenfield et al. | |
| 2017/0263305 A1 | 9/2017 | Cho | |
| 2017/0278583 A1* | 9/2017 | Raghuraman | G11C 17/16 |
| 2018/0158507 A1* | 6/2018 | Bang | G11C 11/40603 |
| 2021/0350844 A1 | 11/2021 | Morohashi et al. | |

OTHER PUBLICATIONS

Office Action for the U.S. Appl. No. 17/505,284 issued by the USPTO dated Nov. 14, 2022.
Office Action for the U.S. Appl. No. 17/505,284 issued by the USPTO dated Apr. 28, 2023.
Office Action for the U.S. Appl. No. 17/505,284 issued by the USPTO dated Feb. 8, 2023.

\* cited by examiner

MEMORY SYSTEM INCLUDING MEMORY DEVICE PERFORMING TARGET REFRESH

CROSS-REFERENCE TO RELATED APPLICATIONS

The present application claims the benefit of U.S. Provisional Patent Application No. 63/125,053, filed on Dec. 14, 2020, and Korean Patent Application No. 10-2021-0116936, filed on Sep. 2, 2021, which are both incorporated herein by reference in their entirety.

BACKGROUND

1. Field

Various embodiments of the present invention relate to a semiconductor design technology, and more particularly, to a memory system including a memory controller for providing to a memory device a target address to select at least one word line to be refreshed during a target refresh operation.

2. Description of the Related Art

A memory cell of a semiconductor memory device includes a transistor that functions as a switch and a capacitor that stores charges (or data). Data is determined to be at a logic high level (logic level 1) and at a logic low level (logic level 0) according to whether there is any charge in the capacitor of a memory cell, that is, whether the terminal voltage of the capacitor is high or low.

Data are stored in a form in which charges are accumulated in a capacitor, and theoretically, there is no power consumption. However, since there may be a leakage current due to such reasons as a PN coupling of a transistor, the initial amount of charges stored in the capacitor may disappear, which leads to the loss of data. To prevent this from occurring, the data in a memory cell is read before the data get lost, and the normal amount of charges according to the read data should be recharged back into the memory cell. The data may be retained only when such an operation is repeated periodically, and the process of recharging cell charges is referred to as a refresh operation which will be, hereinafter, referred to as a normal refresh operation.

Recently, in addition to the normal refresh operation, an additional refresh operation which will be, hereinafter, referred to as a 'target refresh operation', is being performed on the memory cells of a specific word line that is likely to lose data due to row hammering. The row hammering phenomenon refers to a phenomenon in which data of memory cells coupled to a specific word line or the word lines disposed adjacent to the word line are damaged due to a high number of activations of the corresponding word line. To prevent the row hammering phenomenon, a target refresh operation is performed on a word line that is activated more than a predetermined number of times which is, hereinafter, referred to as a 'target word line', and the word lines disposed adjacent to the word line.

Moreover, a memory system that generates a final target address based on the first target address and the second target address has been newly proposed, in a way that a memory controller generates the first target address with a high number (or frequency) of activations, and a memory device generates the second target address with a random sampling. That is, by working together with the memory controller and the memory device to generate the target address, the memory system may reduce the burden on the memory device while increasing the accuracy of the target refresh operation. In a conventional memory system, since only a memory device generates a target address, it is possible to evaluate a target-address-generating operation of the memory device, by using an external test device. However, in the newly proposed memory system, a new method of internally evaluating a target-address-generating operation of both the memory controller and the memory device is needed, in addition to directly connecting and evaluating the target-address-generating operation using an external test device.

SUMMARY

Embodiments of the present invention are directed to a memory system in which a memory controller and a memory device collaboratively generate target addresses for selecting at least one word line to be refreshed during a target refresh operation. Further, by disposing a built-in self test (BIST) circuit and a built-in redundancy analysis (BIRA) circuit in the memory controller, embodiments of the present invention are directed to a memory system capable of performing a test operation on target-address-generating operations of the memory controller and the memory device by using the BIST circuit, and performing a repair operation according to the test result by using the BIRA circuit.

According to an embodiment of the present invention, a memory controller includes: a test module suitable for generating a test command, a test address, and test data during a test operation; a refresh control module suitable for receiving the test command and the test address as an active command and an active address, and generating a first target address by sampling the active address according to the active command, during the test operation; a command/address generation module suitable for providing the active address together with the active command, and providing the first target refresh command together with the first target address to a memory device, while determining whether to repair the active address according to a repair control signal; and a repair analysis module suitable for generating the repair control signal based on a comparison result of the test data and read data from the memory device, during the test operation.

According to an embodiment of the present invention, a memory system includes a memory controller suitable for providing a first target refresh command with a first target address; and a memory device suitable for performing a target refresh operation on at least one word line corresponding to the first target address according to the first target refresh command, while performing the target refresh operation on at least one word line corresponding to a second target address, which is different from the first target address, according to a second target refresh command, wherein the memory controller includes: a test module suitable for generating a test command, a test address, and test data during a test operation; a refresh control module suitable for receiving the test command and the test address as an active command and an active address, and generating a first target address by sampling the active address according to the active command, during the test operation; a command/address generation module suitable for providing the active address together with the active command, and providing the first target refresh command together with the first target address, while determining whether to repair the active address according to a repair control signal; and a repair analysis module suitable for generating the repair control signal based on a comparison result of the test data and read data from the memory device, during the test operation.

According to an embodiment of the present invention, an operation method of a memory system includes writing test data on a memory cell array of the memory device; applying an aggressive pattern to the memory device; generating a first target address by sampling an active address according to an active command, and performing a target refresh operation of the memory device based on the first target address; generating a repair control signal based on a comparison result of the test data and read data from the memory device; and repairing the active address according to the repair control signal.

Further, according to embodiments of the present invention, when the memory controller and the memory device work together to generate the target address, the memory system may perform a test operation on the target-address-generating operations by using the BIST circuit included in the memory controller, and perform a repair operation according to the test result by using the BIRA circuit included in the memory controller, thereby improving refresh efficiency.

DETAILED DESCRIPTION

Figure 1:
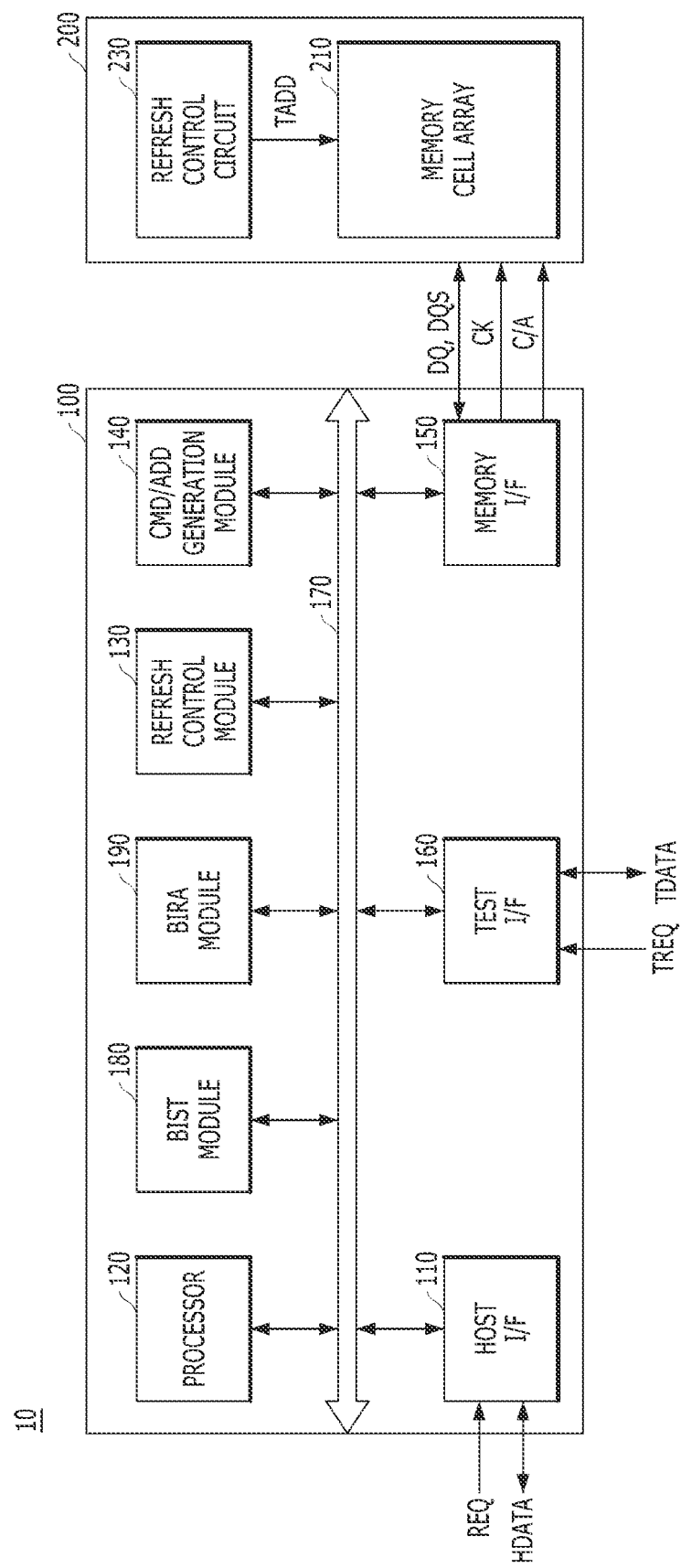
FIG. 1 is a block diagram illustrating a memory system in accordance with an embodiment of the present invention.

Various embodiments of the present invention will be described below in more detail with reference to the accompanying drawings. The present invention may, however, be embodied in different forms and should not be construed as limited to the embodiments set forth herein. Rather, these embodiments are provided so that this disclosure will be thorough and complete, and will fully convey the scope of the present invention to those skilled in the art. Throughout the disclosure, like reference numerals refer to like parts throughout the various figures and embodiments of the present invention.

It will be understood that when an element is referred to as being "coupled" or "connected" to another element, it may mean that the two are directly coupled or the two are electrically connected to each other with another circuit intervening therebetween. It will be further understood that the terms "comprise", "include", "have", etc. when used in this specification, specify the presence of stated features, numbers, steps, operations, elements, components, and/or combinations of them but do not preclude the presence or addition of one or more other features, numbers, steps, operations, elements, components, and/or combinations thereof. In the present disclosure, the singular forms are intended to include the plural forms as well, unless the context clearly indicates otherwise.

Hereinafter, to focus on a refresh operation, a description of a configuration associated with a data input/output operation will be omitted. In particular, for ease of description, an address used by a memory controller in a memory system may be assigned by a reference numeral "_ADD", and an address used in a memory device may be assigned by a reference numeral "ADD_".

Figure 2:
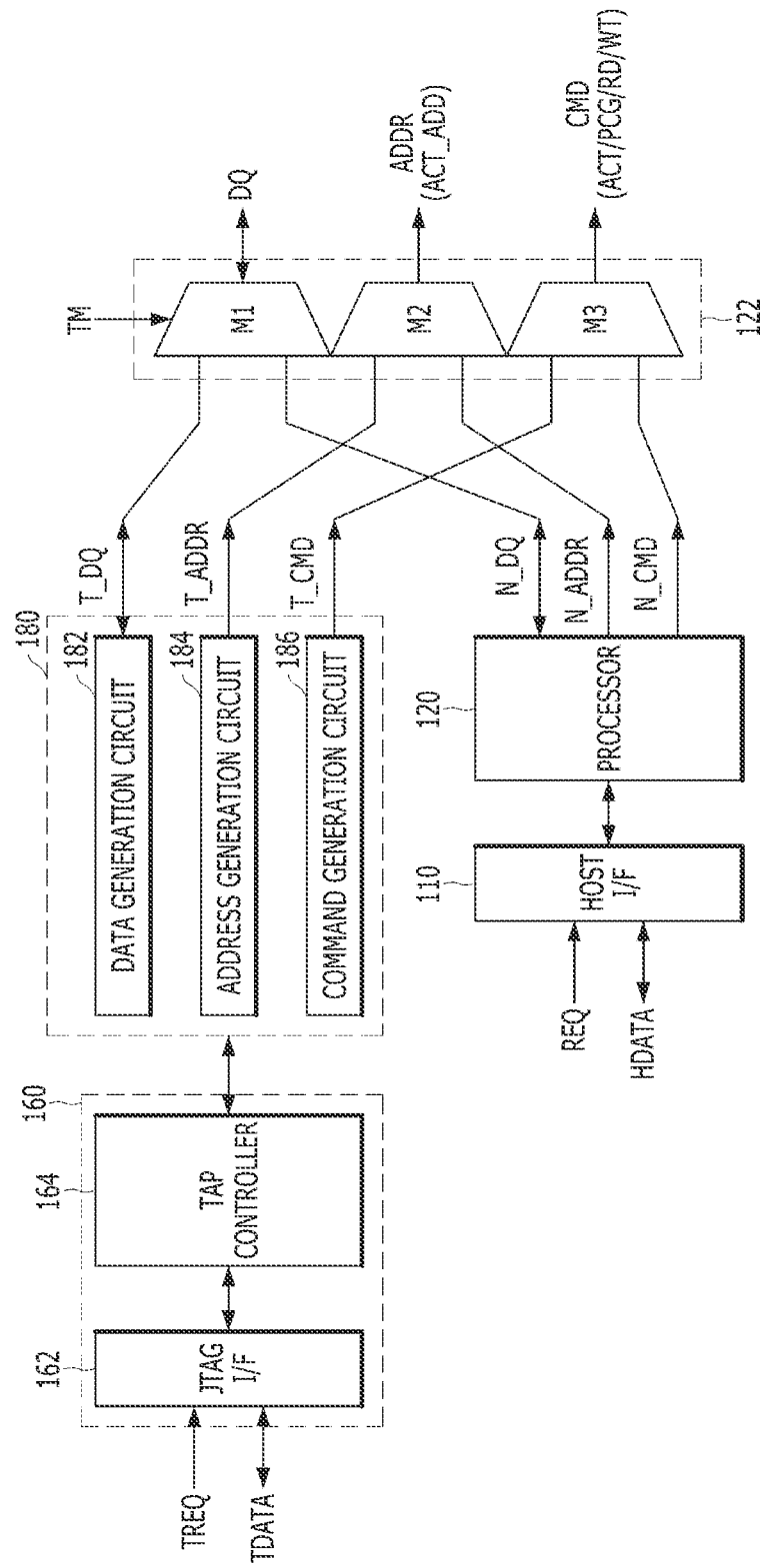
FIG. 2 is a detailed block diagram illustrating a connectivity between configurations of a memory controller in FIG. 1 in accordance with an embodiment of the present invention.

FIG. 1 is a block diagram illustrating a memory system 10 in accordance with an embodiment of the present invention. FIG. 2 is a detailed block diagram illustrating a connectivity between configurations of a memory controller 100 in FIG. 1 in accordance with an embodiment of the present invention.

Referring to FIG. 1, the memory system 10 may include the memory controller 100, and a semiconductor memory device 200.

The memory controller 100 may control the general operation of the memory system 10 and it may control general data exchange between a host and the semiconductor memory device 200. The memory controller 100 may generate a command/address signal C/A according to a request REQ from the host, and provide the generated command/address signal C/A to the semiconductor memory device 200. The memory controller 100 may provide a clock CK together with the command/address signal C/A to the semiconductor memory device 200. The memory controller 100 may provide data DQ corresponding to host data HDATA provided from the host to the semiconductor memory device 200 together with a data strobe signal DQS. The memory controller 100 may receive the data DQ read from the semiconductor memory device 200 together with the data strobe signal DQS, and provide the data DQ and the data strobe signal DQS to the host as the host data HDATA.

In detail, the memory controller 100 may include a host interface (host I/F) 110, a processor 120, a refresh control module 130, a command/address (CMD/ADD) generation module 140, a memory interface (memory I/F) 150, a test interface (test I/F) 160, a bus 170, a built-in self test (BIST) module 180, and a built-in redundancy analysis (BIRA) module 190.

The host interface 110 may be configured to communicate with the host connected to the memory system 10 under the control of the processor 120. For example, the host interface 110 may receive the request REQ and the host data HDATA from the host, and provide the host data HDATA to the host by receiving the data DQ read from the semiconductor memory device 200 through the memory interface 150.

The processor 120 may perform various types of computational and/or other operations for controlling the semiconductor memory device 200, and/or may execute instructions in the form of firmware or other types of software. The processor 120 may receive the request REQ and the host data HDATA provided from the host through the host interface 110, during a normal operation. Referring to FIG. 2, the processor 120 may generate a command N_CMD and an address N_ADDR during the normal operation, and generate data N_DQ corresponding to the host data HDATA, or generate the host data HDATA corresponding to the data DQ transferred from the semiconductor memory device 200. The processor 120 may control overall operations of the host interface 110, the refresh control module 130, the command/address generation module 140, the memory interface 150, the test interface 160, the BIST module 180, and the BIRA module 190.

The test interface 160 may be configured to communicate with an external test device connected to the memory system 10, under the control of the processor 120. For example, during a test operation, the test interface 160 may receive a request TREQ and test seed data TDATA from the test device, and output the test seed data TDATA to the test device by receiving the data DQ read from the semiconductor memory device 200 through the memory interface 150. For example, referring to FIG. 2, the test interface 160 may include a joint test action group (JTAG) Interface (JTAG I/F) 162, and a test access point (TAP) controller 164. The JTAG interface 162 may include a structure of IEEE 1149.1 Standard Test Access Port and Boundary-Scan Architecture, and may provide an interface with the test device. The JTAG interface 162 may receive the request TREQ and the test seed data TDATA having a preset output form provided from the test device, and perform a first conversion operation on the request TREQ and the test seed data TDATA to have a logic control form, during the test operation. The TAP controller 164 may decode an output signal provided from the JTAG interface 162, and perform a second conversion operation on the decoded signal to have a control form suitable for the BIST module 180.

The BIST module 180 may receive the request TREQ and the test seed data TDATA from the test device through the test interface 160. Referring to FIG. 2, the BIST module 180 may generate a test command T_CMD and a test address T_ADDR corresponding to the request TREQ. The BIST module 180 may generate test data T_DQ corresponding to the test seed data TDATA, or generate the test seed data TDATA corresponding to the data DQ transferred from the semiconductor memory device 200. For example, referring to FIG. 2, the BIST module 180 may include a data generation circuit 182, an address generation circuit 184, and a command generation circuit 186. The data generation circuit 182 may generate the test data T_DQ corresponding to the test seed data TDATA, or generate the test seed data TDATA corresponding to the test data T_DQ. The address generation circuit 184 may generate the test address T_ADDR corresponding to the request TREQ. The command generation circuit 186 may generate the test command T_CMD corresponding to the request TREQ. Depending on an embodiment, the BIST module 180 may generate a test mode signal TM notifying an entry of the test operation according to the request TREQ provided from the test device.

The memory controller 100 may further include an arbitration circuit 122 for selecting the command N_CMD, the address N_ADDR, and the data N_DQ provided from the processor 120 during the normal operation, and selecting the test command T_CMD, the test address T_ADDR, and the test data T_DQ provided from the BIST module 180 during the test operation. Referring to FIG. 2, the arbitration circuit 122 may select the test command T_CMD, the test address T_ADDR, and the test data T_DQ provided from the BIST module 180, when the test mode signal TM is enabled. The arbitration circuit 122 may select the command N_CMD, the address N_ADDR, and the data N_DQ provided from the processor 120, when the test mode signal TM is disabled.

For example, the arbitration circuit 122 may include first to third multiplexers M1 to M3. The first multiplexer M1 may be implemented with a bidirectional multiplexer. The first multiplexer M1 may select one of the data N_DQ and the test data T_DQ according to the test mode signal TM, and output the data DQ to the memory interface 150. The first multiplexer M1 may output the data DQ transferred from the memory interface 150 as one of the data N_DQ and the test data T_DQ according to the test mode signal TM. The second multiplexer M2 may select one of the address N_ADDR and the test address T_ADDR according to the test mode signal TM, and output an address ADDR to the refresh control module 130 and the command/address generation module 140. The third multiplexer M3 may select one of the command N_CMD and the test command T_CMD according to the test mode signal TM, and output a command CMD to the refresh control module 130 and the command/address generation module 140. Depending on an embodiment, the arbitration circuit 122 may be included in the processor 120.

For reference, the command CMD may include an active command ACT, a precharge command PCG, a read command RD, and a write command WT. However, the present invention is not limited thereto. According to an embodiment, the command CMD may further include commands needed for an operation of the semiconductor memory device 200, such as a mode register set (MRS) command. The address ADDR generated with the active command ACT may be defined as an active address ACT_ADD.

The refresh control module 130 may generate commands relating to a refresh operation, such as a normal refresh command (REF of FIG. 3) and a first target refresh command (TREF1 of FIG. 3), based on the active command ACT provided from the arbitration circuit 122. The refresh control module 130 may generate the first target refresh command TREF1 after generating a set number of the normal refresh commands REF at regular intervals whenever the number of inputs of the active command ACT reaches a certain number. The refresh control module 130 may generate a first target address (TREF1_ADD of FIG. 3) with a high number of activations or high frequency of activations by sampling the active address ACT_ADD according to the active command ACT. That is, during the normal operation, the refresh control module 130 may receive the command N_CMD and the address N_ADDR provided through the arbitration circuit 122, as the active command ACT and the active address ACT_ADD, and generate the first target address TREF1_ADD by sampling the active address ACT_ADD according to the active command ACT. During the test operation, the refresh control module 130 may receive the test command T_CMD and the test address T_ADDR, as the active command ACT and the active address ACT_ADD, and generate the first target address TREF1_ADD by sampling the active address ACT_ADD according to the active command ACT. A detailed configuration of the refresh control module 130 in accordance with the embodiment will be described in FIG. 3.

The command/address generation module 140 may generate the command/address signal C/A by scheduling the command CMD and the address ADDR provided from the arbitration circuit 122, and the normal refresh commands REF, the first target refresh command TREF1, and the first target address TREF1_ADD provided from the refresh control module 130. The command/address generation module 140 may provide the active address ACT_ADD together with the active command ACT, as the command/address signal C/A, and provide the first target refresh command TREF1 together with the first target address TREF1_ADD as the command/address signal C/A. The command/address generation module 140 may provide the active address ACT_ADD together with the read command RD or the write command WT, as the command/address signal C/A. The command/address generation module 140 may provide the normal refresh commands REF as the command/address signal C/A. Further, the command/address generation module 140 may provide the active address ACT_ADD together with the commands needed for an operation of the semiconductor memory device 200, such as the MRS command, as the command/address signal C/A. In particular, the command/address generation module 140 may determine whether to repair the address ADDR (e.g., the active address ACT_ADD) according to a repair control signal (REPAIR_EN of FIG. 3) provided from the BIRA module 190. A detailed configuration of the command/address generation module 140 in accordance with the embodiment will be described in FIG. 5.

The memory interface 150 may be configured to communicate with the semiconductor memory device 200 under the control of the processor 120. For example, the memory interface 150 may transmit the command/address signal C/A and the data DQ to the semiconductor memory device 200, and transmit the data DQ read from the semiconductor memory device 200 to the host interface 110.

The BIRA module 190 may generate the repair control signal REPAIR_EN by determining whether re-mapping of the address ADDR is required, i.e., a repair of the address ADDR is required, based on a comparison result of the test data T_DQ generated by the BIST module 180 and the data DQ read from the semiconductor memory device 200, during the test operation. A detailed configuration of the BIRA module 190 in accordance with the embodiment will be described in FIG. 4.

The processor 120 may transmit data between the host interface 110, the refresh control module 130, the command/address generation module 140, the memory interface 150, the test interface 160, the BIST module 180, and the BIRA module 190 via the bus 170. According to an embodiment, the host interface 110, the refresh control module 130, the command/address generation module 140, the memory interface 150, the test interface 160, the BIST module 180, and the BIRA module 190 may communicate with each other independently without passing through the bus 170. For example, the refresh control module 130 and host interface 110 may communicate directly with each other without passing through the bus 170. The refresh control module 130 and the memory interface 150 may communicate with each other directly without passing through the bus 170. The host interface 110 and the memory interface 150 may also communicate directly with each other without passing through the bus 170.

The semiconductor memory device 200 may perform a refresh operation, a write operation, and a read operation according to the clock CK, the command/address signal C/A, the data strobe signal DQS, and/or the data DQ that are provided from the memory controller 100. The refresh operation may include a normal refresh operation in which the semiconductor memory device 200 sequentially refreshes a plurality of word lines during a normal refresh period, and a target refresh operation in which one or more neighboring word lines disposed adjacent to a word line having a large number (or frequency) of activations are refreshed, during a target refresh period.

The semiconductor memory device 200 may generate an internal command (ICMD of FIG. 11) and an internal address (IADD of FIG. 11) by buffering the command/address signal C/A, and generate an active command ACT, a precharge command PCG, a normal refresh command REF, and a first target refresh command TREF1, which are related to a row control operation, by decoding the command ICMD. The semiconductor memory device 200 may generate a second target refresh command (TREF2 of FIG. 11) whenever the number of inputs of the normal refresh command REF reaches a set number. That is, the first target refresh command TREF1 may be generated and provided from the memory controller 100 while the second target refresh command TREF2 may be generated by the semiconductor memory device 200 itself.

The semiconductor memory device 200 may perform the normal refresh operation according to the normal refresh command REF and perform the target refresh operation according to the first target refresh command TREF1 or the second target refresh command TREF2. For reference, the internal address IADD may correspond to the active address ACT_ADD when the active command ACT is generated. Depending on an embodiment, the internal address IADD may correspond to the first target address TREF1_ADD when the first target refresh command TREF1 is generated. Further, the semiconductor memory device 200 may additionally generate commands related to data input/output operations (e.g., a read command RD or a write command WT) by decoding the internal command ICMD.

In detail, the semiconductor memory device 200 may include a memory cell array 210 and a refresh control circuit 230.

The memory cell array 210 may include a plurality of memory cells coupled to a plurality of word lines and a plurality of bit lines may be arranged in the form of an array.

The refresh control circuit 230 may provide a final target address TADD to select a word line to be refreshed during the target refresh operation, among the word lines. The refresh control circuit 230 may generate a second target address (ADD_TREF2 of FIG. 11) by sampling the active address ACT_ADD according to the active command ACT. The refresh control circuit 230 may output the final target address TADD by selecting one of the first target address TREF1_ADD and the second target address ADD_TREF2 according to the second target refresh command TREF2. The refresh control circuit 230 may select the first target address TREF1_ADD when the second target refresh command TREF2 is not inputted, and select the second target address ADD_TREF2 different from the first target address TREF1_ADD when the second target refresh command TREF2 is inputted.

Accordingly, the semiconductor memory device 200 may perform the target refresh operation on a word line corresponding to the first target address TREF1_ADD in response to the first target refresh command TREF1, while performing the target refresh operation on a word line corresponding to the second target address ADD_TREF2, which is different from the first target address TREF1_ADD, in response to the second target refresh command TREF2. A detailed configuration of the semiconductor memory device 200 in accordance with the embodiment will be described in FIGS. 11 and 12.

Figure 3:
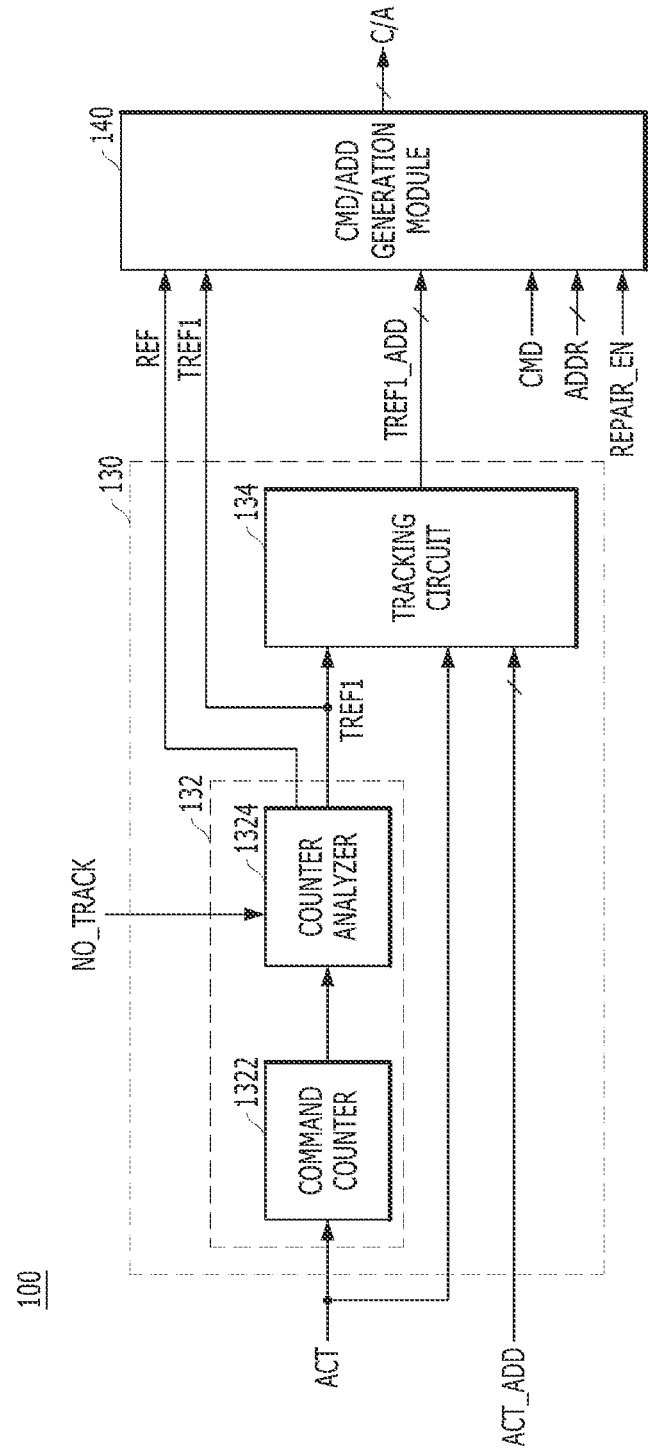
FIG. 3 is a detailed block diagram illustrating a refresh control module of FIG. 1 in accordance with an embodiment of the present invention.

FIG. 3 is a detailed block diagram illustrating the refresh control module 130 of FIG. 1 in accordance with an embodiment of the present invention.

Referring to FIG. 3, the refresh control module 130 may include a refresh command issue circuit 132 and a tracking circuit 134.

The refresh command issue circuit 132 may generate the normal refresh command REF and the first target refresh command TREF1, based on the active command ACT. The refresh command issue circuit 132 may issue the first target refresh command TREF1 or the normal refresh command REF when the number of inputs of the active command ACT reaches a certain number. The refresh command issue circuit 132 may stop issuing the first target refresh command TREF1 according to a no-tracking signal NO_TRACK. That is, when the no-tracking signal NO_TRACK is enabled, a target-address-generating operation of the refresh control module 130, for selecting the first target address TREF1_ADD, may be stopped. Depending on an embodiment, the no-tracking signal NO_TRACK may be generated by the processor 120 or the BIST module 180.

For example, the refresh command issue circuit 132 may include a command counter 1322 and a counter analyzer 1324.

The command counter 1322 may generate a count value by counting the number of inputs of the active command ACT. The counter analyzer 1324 may issue a set number of the normal refresh commands REF at regular intervals when the count value reaches the certain number. The command counter 1322 may stop issuing the first target refresh command TREF1 when the no-tracking signal NO_TRACK is enabled.

The counter analyzer 1324 may issue the first target refresh command TREF1 after issuing the set number of the normal refresh commands REF. For example, the counter analyzer 1324 may issue at least one first target refresh command TREF1 after issuing 4096 normal refresh commands REF whenever the count value reaches 10.

The tracking circuit 134 may generate the first target address TREF1_ADD by sampling the active address ACT_ADD in response to the active command ACT. The tracking circuit 134 may output the first target address TREF1_ADD at each issue of the first target refresh command TREF1. A detailed configuration of the tracking circuit 134 in accordance with the embodiment will be described in FIGS. 6 to 10.

The command/address generation module 140 may generate a repair address (REP_ADD of FIG. 5) by determining whether to repair the address ADDR including the active address ACT_ADD, according to the repair control signal REPAIR_EN. The command/address generation module 140 may output the repair address REP_ADD together with the active command ACT, as the command/address signal C/A, provide the repair address REP_ADD together with the read command RD or the write command WT as the command/address signal C/A, and provide the normal refresh command REF as the command/address signal C/A. The command/address generation module 140 may output the first target refresh command TREF1 together with the first target address TREF1_ADD as the command/address signal C/A.

Figure 4:
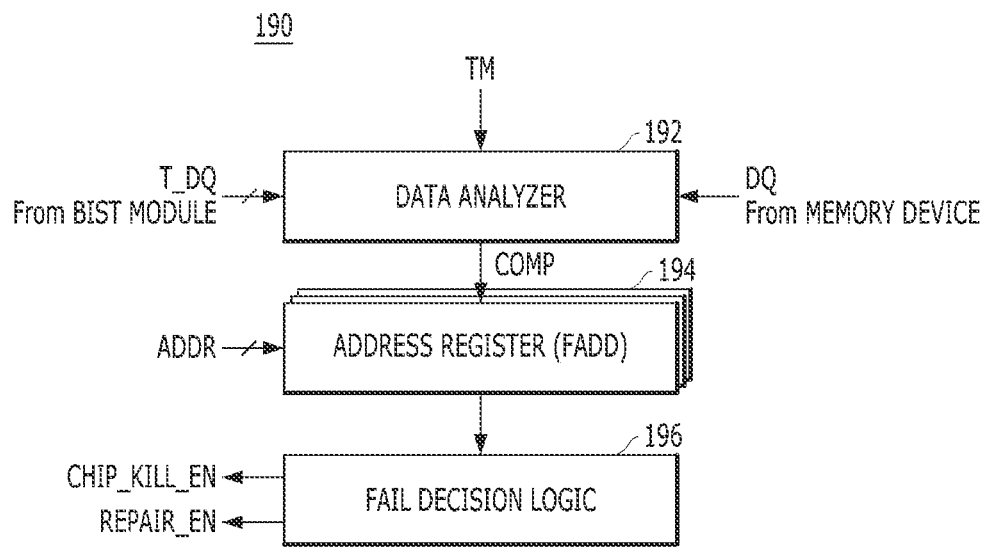
FIG. 4 is a detailed block diagram illustrating a BIRA module of FIG. 1 in accordance with an embodiment of the present invention.

FIG. 4 is a detailed block diagram illustrating the BIRA module 190 of FIG. 1 in accordance with an embodiment of the present invention.

Referring to FIG. 4, the BIRA module 190 may include a data analyzer 192, a plurality of address registers 194, and a fail decision logic 196.

The data analyzer 192 may generate a comparison signal COMP by comparing the test data T_DQ generated by the BIST module 180 with the data DQ read from the semiconductor memory device 200 in response to the test mode signal TM. The data analyzer 192 may be activated when the test mode signal TM is enabled. The data analyzer 192 may compare each bit of the test data T_DQ with the data DQ to enable the comparison signal COMP when even one bit is different. That is, the data analyzer 192 may enable the comparison signal COMP when the test data T_DQ is different from the data DQ.

Moreover, the address ADDR may include a row address for designating a row (i.e., a word line) of the memory cell array 210, and a column address for designating a column (i.e., a bit line) of the memory cell array 210. Depending on an embodiment, the data analyzer 192 may enable the comparison signal COMP by detecting a case in which two or more column failures occur per row. For this, the data analyzer 192 may enable the comparison signal COMP by detecting a case in which two or more column failures occur per row, based on the data DQ read from the semiconductor memory device 200 by selecting a row address while sequentially increasing a column address.

The address registers 194 may sequentially store the address ADDR, i.e., the active address ACT_ADD, as a plurality of fail addresses FADD whenever the comparison signal COMP is enabled.

The fail decision logic 196 may generate a counting value by counting the number of the fail addresses FADD stored in the address registers 194, and enable the repair enable signal REPAIR_EN or a chip-kill signal CHIP_KILL_EN according to the counting value. The fail decision logic 196 may enable the chip-kill signal CHIP_KILL_EN when the counting value is greater than a threshold value. The chip-kill signal CHIP_KILL_EN may be provided to the external test device through the test interface 160. When the chip-kill signal CHIP_KILL_EN is enabled, the test device may determine that the number of failed addresses during the test operation exceeds a repairable range and discard the corresponding memory device 200 not to be used. The fail decision logic 196 may enable the repair enable signal REPAIR_EN when the counting value is lower than or equal to the threshold value. When the repair enable signal REPAIR_EN is enabled, the command/address generation module 140 may output the repair address REP_ADD by re-mapping the address ADDR to a redundancy address R_ADD. Thus, the address ADDR may be repaired by the redundancy address R_ADD.

Figure 5:
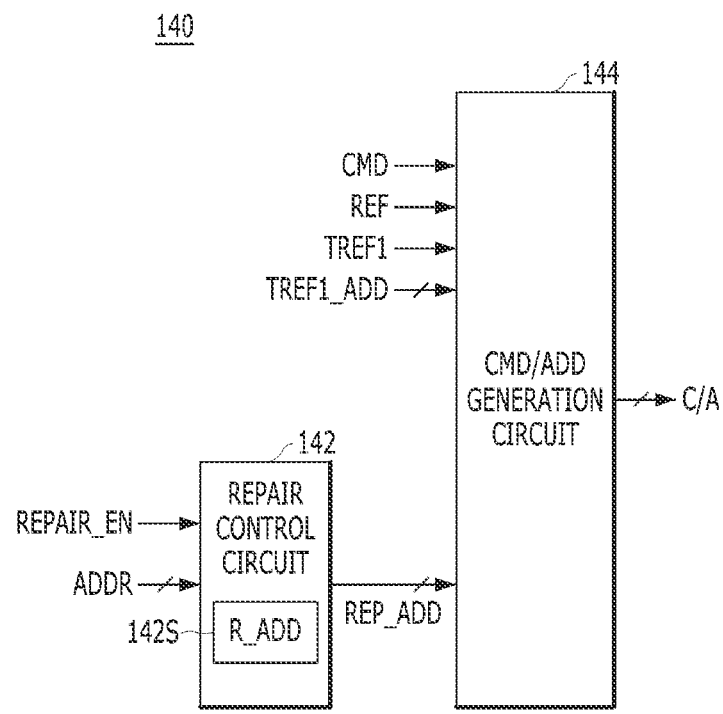
FIG. 5 is a detailed block diagram illustrating a command/address generation module of FIG. 1 in accordance with an embodiment of the present invention.

FIG. 5 is a detailed block diagram illustrating the command/address generation module 140 of FIG. 1 in accordance with an embodiment of the present invention.

Referring to FIG. 5, the command/address generation module 140 includes a repair control circuit 142, and a command/address generation circuit 144.

The repair control circuit 142 may include at least one storage 142S for storing at least one redundancy address R_ADD. The repair control circuit 142 may compare the address ADDR with the fail addresses FADD stored in the address registers 194 in response to the repair enable signal REPAIR_EN, and output the repair address REP_ADD by re-mapping the address ADDR to the redundancy address R_ADD according to the comparison result. When the repair enable signal REPAIR_EN is enabled, the repair control circuit 142 may output the repair address REP_ADD by re-mapping the address ADDR to the redundancy address R_ADD. When the repair enable signal REPAIR_EN is disabled, the repair control circuit 142 may output the repair address REP_ADD without re-mapping the address ADDR.

The command/address generation circuit 144 may provide the repair address REP_ADD together with the active command ACT, as the command/address signal C/A, provide the repair address REP_ADD together with the read command RD or the write command WT, as the command/address signal C/A, and provide the normal refresh command REF as the command/address signal C/A. The command/address generation circuit 144 may provide the first target refresh command TREF1 together with the first target address TREF1_ADD as the command/address signal C/A.

As described above, the memory system 10 in accordance with an embodiment may generate the final target address TADD in a way that the memory controller 100 may generate the first target address TREF1_ADD with a high number (or frequency) of activations, and the memory device 200 may generate the second target address ADD_TREF2 with a random sampling. That is, since the memory controller 100 and the memory device 200 work together to sample the target address TADD, the memory system 10 may reduce the burden on the memory device 200 while increasing the accuracy of the target refresh operation.

Further, the memory system 10 in accordance with an embodiment may dispose the BIST module 180 and the BIRA module 190 in the memory controller 100, and perform a test operation on target-address-generating operations of the memory controller 100 and the memory device 200 by using the BIST module 180. Further, the memory system 10 in accordance with an embodiment may perform a repair operation (i.e., re-mapping of the address ADDR), according to the test result by using the BIRA module 190. Thus, the memory system may maximize the target refresh efficiency.

Hereinafter, referring to FIGS. 6 to 10, the tracking circuit 134 will be described in detail.

Figure 6:
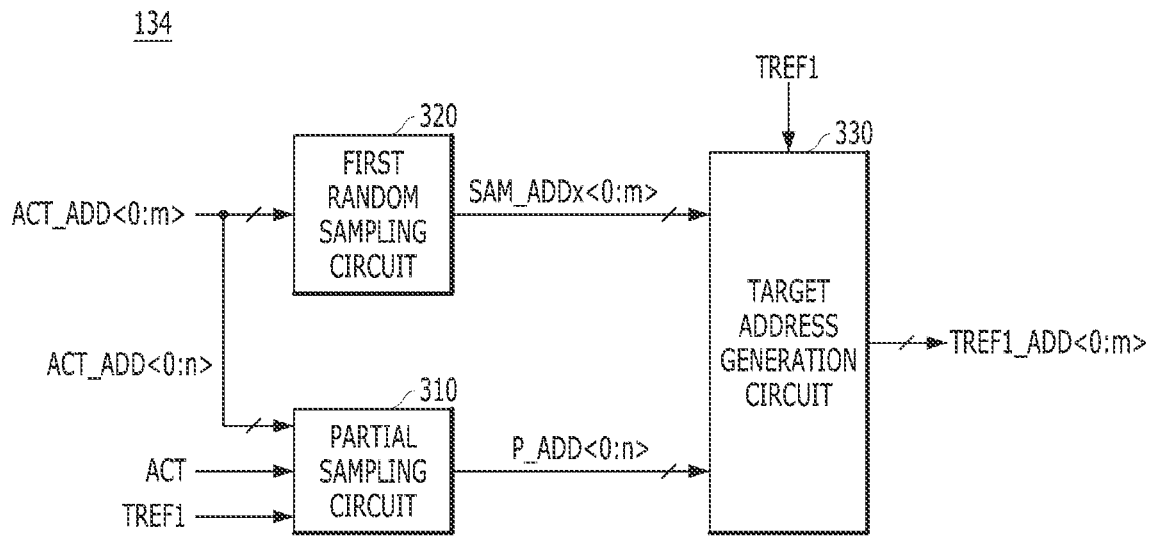
FIG. 6 is a detailed block diagram illustrating a tracking circuit of FIG. 3 in accordance with an embodiment of the present invention.

FIG. 6 is a detailed block diagram illustrating the tracking circuit 134 of FIG. 3 in accordance with an embodiment of the present invention.

Referring to FIG. 6, the tracking circuit 134 may include a partial sampling circuit 310, a first random sampling circuit 320, and a target address generation circuit 330.

The partial sampling circuit 310 may store some bits of the active address ACT_ADD (e.g., ACT_ADD<0:m>) as a partial address ACT_ADD<0:n>, where n and m are natural numbers, and n is less than m, according to the active command ACT. The partial sampling circuit 310 may set a priority address P_ADD<0:n> by counting the number of inputs of the partial address ACT_ADD<0:n>. The partial sampling circuit 310 may be initialized at each issue of the first target refresh command TREF1 to reset the priority address P_ADD<0:n>. The first random sampling circuit 320 may generate a plurality of sampling addresses SAM_ADDx<0:m>, where x is a natural number greater than 1, by randomly sampling the active address ACT_ADD<0:m>. The target address generation circuit 330 may output any of the sampling addresses SAM_ADDx<0: m>, which are identical to the priority address P_ADD<0: n>, as the first target address TREF1_ADD<0:m>, in response to the first target refresh command TREF1.

Figure 7:
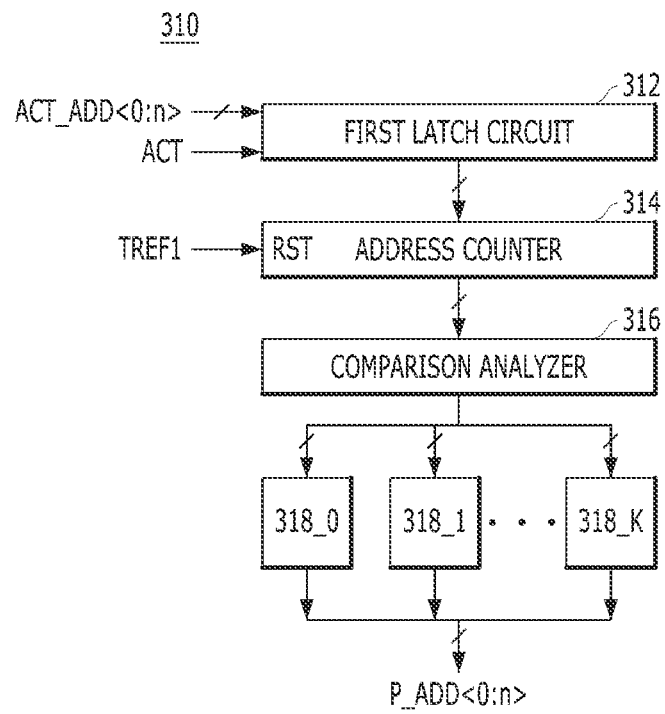
FIG. 7 is a detailed block diagram illustrating a partial sampling circuit of FIG. 6 in accordance with an embodiment of the present invention.
Figure 8:
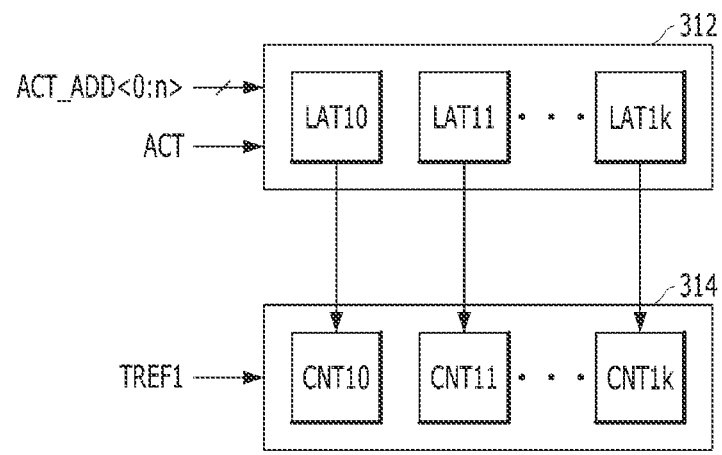
FIG. 8 is a detailed block diagram illustrating a first latch circuit and an address counter of FIG. 7 in accordance with an embodiment of the present invention.

FIG. 7 is a detailed block diagram illustrating the partial sampling circuit 310 of FIG. 6 in accordance with an embodiment of the present invention. FIG. 8 is a detailed block diagram illustrating a first latch circuit 312 and an address counter 314 of FIG. 7 in accordance with an embodiment of the present invention.

Referring to FIG. 7, the partial sampling circuit 310 may include the first latch circuit 312, the address counter 314, a comparison analyzer 316, and a plurality of priority address storages 318_0 to 318_k.

The first latch circuit 312 may store (n+1) bits in the active address ACT_ADD<0:m> of (m+1) bits as the partial address ACT_ADD<0:n> of (n+1) bits, when the active command ACT is inputted. For example, the first latch circuit 312 stores the lower 4 bits in the 12-bit active address ACT_ADD<0:11> as the 4-bit partial address ACT_ADD<0:3>. In an embodiment, the lower 4 bits in the active address ACT_ADD<0:11> may be used to specify the word lines of the memory cell array 210. Referring to FIG. 8, the first latch circuit 312 may include a plurality of latches LAT10 to LAT1k, each of which may store, as the partial address ACT_ADD<0:n>, (n+1) bits in the active address ACT_ADD<0:m> of (m+1) bits in response to the active command ACT. The first latch circuit 312 may store plural partial addresses ACT_ADD<0:n> for as many as a number of the latches LAT10 to LAT1k.

The address counter 314 may generate a plurality of counting values by counting the number of inputs of the partial address ACT_ADD<0:n> into each of the latches LAT10 to LAT1k whenever the same partial address ACT_ADD<0:n> is stored in a corresponding latch of the latches LAT10 to LAT1k in response to the active command ACT. The address counter 314 may be initialized by the first target refresh command TREF1. That is, the address counter 314 may cumulatively count the number of inputs of the partial address ACT_ADD<0:n> during each cycle of the issue of the first target refresh command TREF1. Referring to FIG. 8, the address counter 314 may include a plurality of counters CNT10 to CNT1k respectively corresponding to the latches LAT10 to LAT1k. Each of the counters CNT10 to CNT1k may increase its counting value by +1 whenever the same partial address ACT_ADD<0:n> is stored into a corresponding one of the latches LAT10 to LAT1k.

The comparison analyzer 316 may compare the counting values provided from the address counter 314 to arrange the partial addresses ACT_ADD<0:n> respectively stored in the latches LAT10 to LAT1k according to a priority in descending order of the counting values. The comparison analyzer 316 may sequentially store, respectively into the priority address storages 318_0 to 318_k, the partial addresses ACT_ADD<0:n> arranged according to the priority. The priority address storages 318_0 to 318_k may output the priority address P_ADD<0:n> having the highest priority among the arranged partial addresses ACT_ADD<0:n> stored therein.

Figure 9:
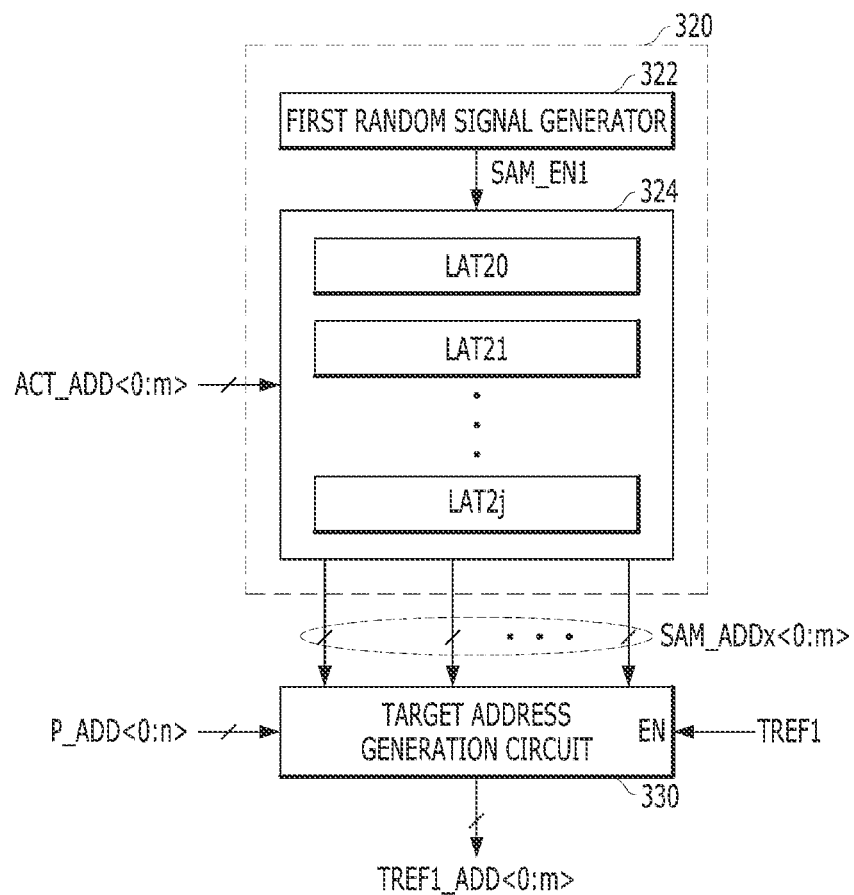
FIG. 9 is a detailed block diagram illustrating a first random sampling circuit of FIG. 6 in accordance with an embodiment of the present invention.
Figure 10:
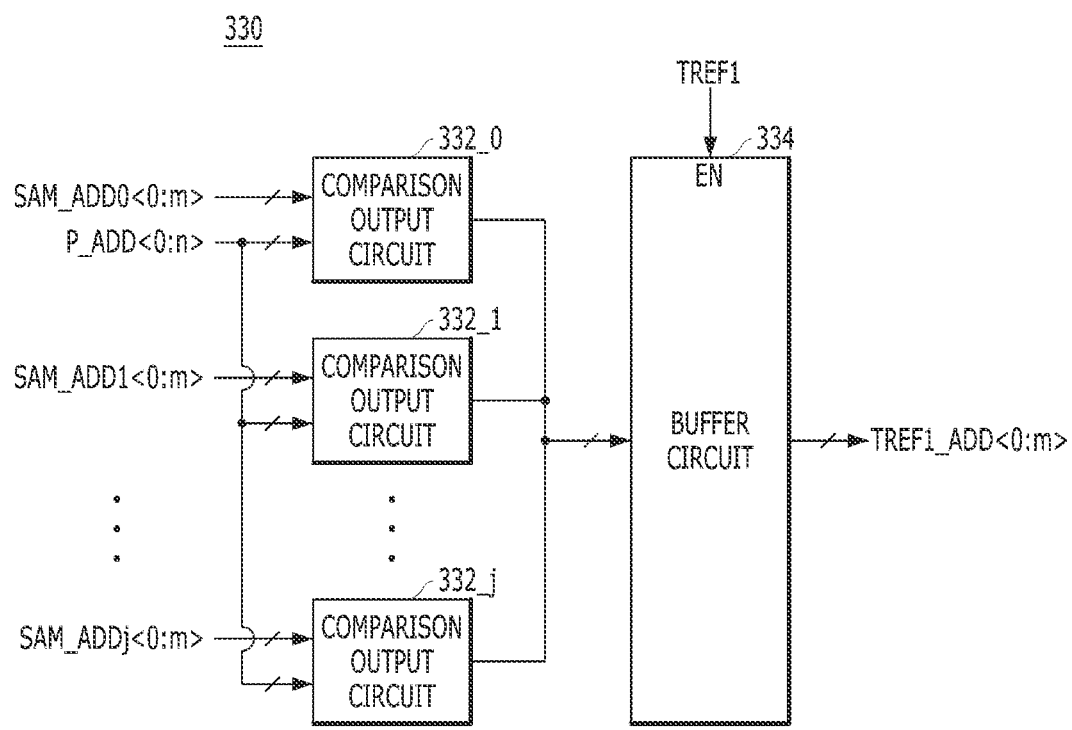
FIG. 10 is a detailed block diagram illustrating a target address generation circuit of FIG. 6 in accordance with an embodiment of the present invention.

FIG. 9 is a detailed block diagram illustrating the first random sampling circuit 320 of FIG. 6 in accordance with an embodiment of the present invention. FIG. 10 is a detailed block diagram illustrating the target address generation circuit 330 of FIG. 9 in accordance with an embodiment of the present invention.

Referring to FIG. 9, the first random sampling circuit 320 may include a first random signal generator 322 and a second latch circuit 324.

The first random signal generator 322 may generate a first sampling signal SAM_EN1 that is randomly enabled. The first random signal generator 322 may be implemented with a linear feedback shift register (LFSR) based random pattern generator.

The second latch circuit 324 may store the active address ACT_ADD<0:m> as the sampling addresses SAM_ADDx<0:m>, where x is a natural number from 0 to j, according to the first sampling signal SAM_EN1. For example, the second latch circuit 324 may include a plurality of latches LAT20 to LAT2j, which may sequentially store the active address ACT_ADD<0:m> as the sampling addresses SAM_ADDx<0:m> whenever the first sampling signal SAM_EN1 is enabled. At this time, since each of the latches LAT20 to LAT2j may store all of the bits (i.e., (m+1) bits) in the active address ACT_ADD<0:m>, the second latch circuit 324 may have a size larger than the first latch circuit 312.

The target address generation circuit 330 may be activated in response to the first target refresh command TREF1. The target address generation circuit 330 may output any of the sampling addresses SAM_ADDx<0:m>, which are identical to the priority address P_ADD<0:n>, as the first target address TREF1_ADD<0:m>, in response to the first target refresh command TREF1.

Referring to FIG. 10, the target address generation circuit 330 may include a plurality of comparison output circuits 332_0 to 332_j and a buffer circuit 334.

The comparison output circuits 332_0 to 332_j may respectively correspond to the sampling addresses SAM_ADDx<0:m>. Each of the comparison output circuits 332_0 to 332_j may output a corresponding sampling address of the sampling addresses SAM_ADDx<0:m> by comparing the corresponding sampling address with the priority address P_ADD<0:n>. Each of the comparison output circuits 332_0 to 332_j may output the corresponding sampling address when some bits (e.g., SAM_ADDx<0:n>) in the corresponding sampling address are identical to all of the bits in the priority address P_ADD<0:n>. The buffer circuit 334 may buffer and output the sampling addresses SAM_ADDx<0:m> outputted from the comparison output circuits 332_0 to 332j as the first target address TREF1_ADD<0:m>, in response to the first target refresh command TREF1. For example, when the priority address P_ADD<0:3> of "0101" is inputted in a state that the first sampling address SAM_ADD0<0:11> is "110101010101" and the second sampling address SAM_ADD1<0:11> is "110101010111", the target address generation circuit 330 may output the first sampling address SAM_ADD0<0:11> whose lower 4 bits are identical to the priority address P_ADD<0:3> of "0101" as the first target address TREF1_ADD<0:11>.

With the above configuration shown in FIGS. 6 to 10, the refresh control module 130 may generate the first target address TREF1_ADD with a high number (or frequency) of activations by counting the number of inputs of the active address ACT_ADD according to the active command ACT. The refresh control module 130 may track only a few bits of the active address ACT_ADD to predict the frequency of the active address occurrence, and randomly sample the active addresses ACT_ADD based on the predicted result to select the first target address TREF1_ADD from among the selected active addresses ACT_ADD. Thus, the memory system 10 may maximize the address sampling accuracy while reducing the area burden on the memory controller 100.

Figure 11:
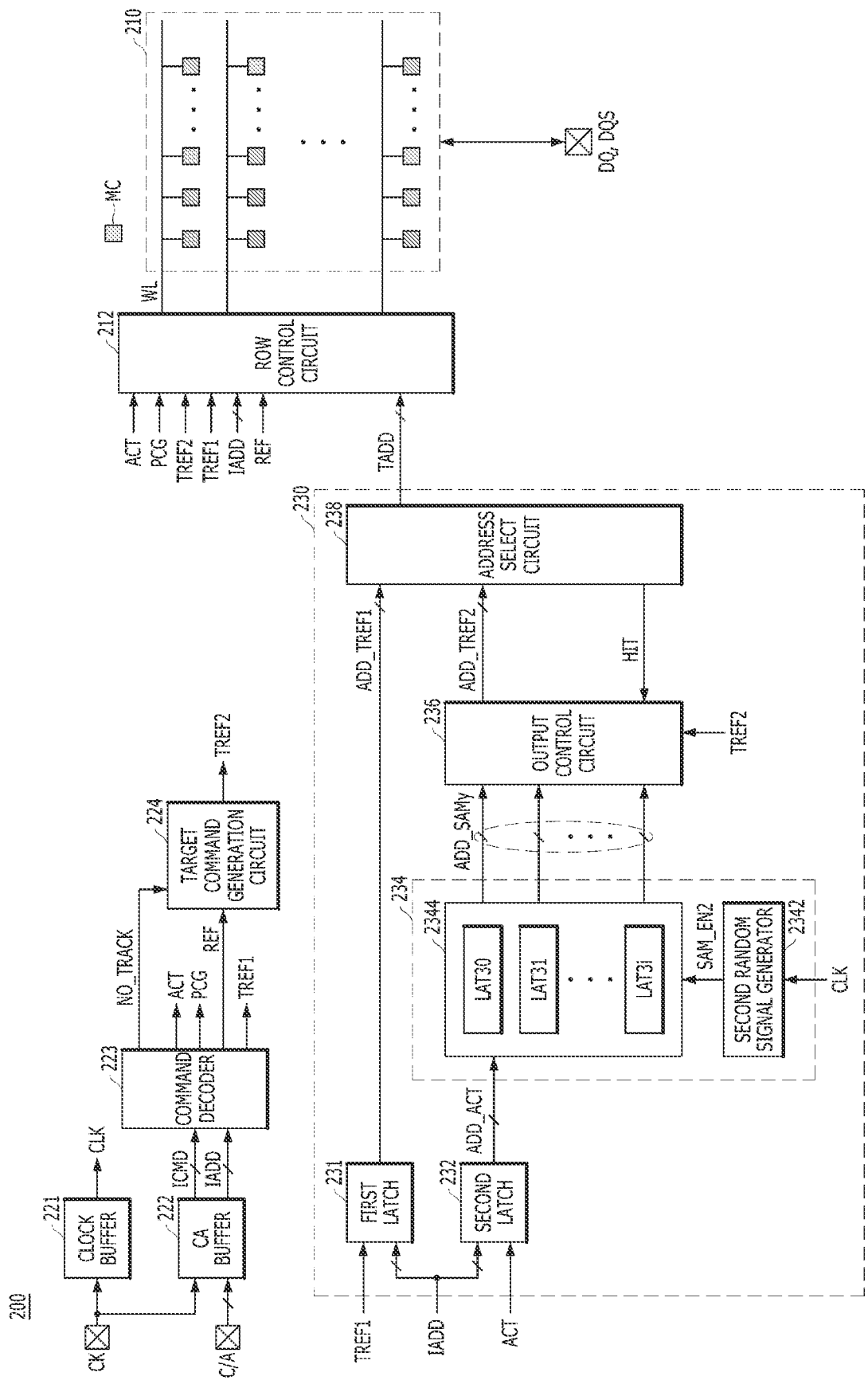
FIG. 11 is a detailed block diagram illustrating a memory device shown in FIG. 1 in accordance with an embodiment of the present invention.
Figure 12:
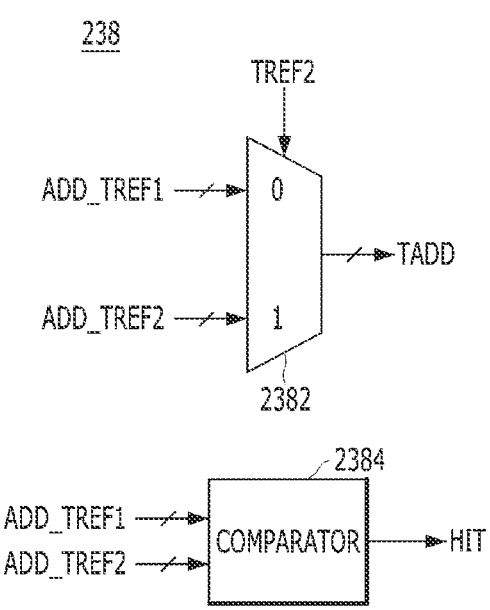
FIG. 12 is a detailed configuration diagram illustrating an address select circuit of FIG. 11 in accordance with an embodiment of the present invention.

FIG. 11 is a detailed block diagram illustrating the semiconductor memory device 200 shown in FIG. 1 in accordance with an embodiment of the present invention. FIG. 12 is a detailed configuration diagram illustrating an address select circuit 238 of FIG. 11 in accordance with an embodiment of the present invention.

Referring to FIG. 11, the semiconductor memory device 200 may include the memory cell array 210, a row control circuit 212, a clock buffer 221, a command/address (CA) buffer 222, a command decoder 223, a target command generation circuit 224, and the refresh control circuit 230.

The memory cell array 210 may include a plurality of memory cells MC coupled to word lines WL and bit lines may be arranged in the form of an array. The memory cell array 210 may be composed of at least one bank. The number of banks or the number of memory cells MC may be determined depending on the capacity of the semiconductor memory device 200.

The clock buffer 221 may receive a clock CK from the memory controller 100. The clock buffer 221 may generate an internal clock CLK by buffering the clock CK. Depending on an embodiment, the memory controller 100 may transfer system clocks CK_t and CK_c to the semiconductor memory device 200 in a differential manner, and the semiconductor memory device 200 may include clock buffers that receive the differential clocks CK_t and CK_c, respectively.

The CA buffer 222 may receive a command/address signal C/A from the memory controller 100 based on the clock CK. The CA buffer 222 may sample the command/address signal C/A based on the clock CK and output an internal command ICMD and an internal address IADD. Consequently, the semiconductor memory device 200 may be synchronized with the clock CK.

The command decoder 223 may decode the internal command ICMD which is output from the CA buffer 222 to generate an active command ACT, a precharge command PCG, a normal refresh command REF, and a first target refresh command TREF1. Although not illustrated, the command decoder 223 may additionally generate a read command RD, a write command WT, a mode register command MRS, and the like by decoding the internal command ICMD.

The target command generation circuit 224 may generate a second target refresh command TREF2 based on the normal refresh command REF. The target command generation circuit 224 may stop issuing the second target refresh command TREF2 according to a no-tracking signal NO_TRACK. That is, when the no-tracking signal NO_TRACK is enabled, a target-address-generating operation of the memory device 200, for selecting a second target address ADD_TREF2, may be stopped. Depending on an embodiment, the no-tracking signal NO_TRACK may be provided as a form of the command/address signal C/A from the memory controller 100, and generated by the command decoder 223. The target command generation circuit 224 may generate the second target refresh command TREF2 whenever the number of inputs of the normal refresh command REF reaches a certain number. In an embodiment, a frequency of the first target refresh command TREF1 issued by the refresh command issue circuit 132 of the memory controller 100 may be set differently from a frequency of the second target refresh command TREF2 issued by the target command generation circuit 224 of the semiconductor memory device 200. For example, the first target refresh command TREF1 may be generated after issuing 4096 normal refresh commands REF, and the second target refresh command TREF2 may be generated after issuing 8092 normal refresh commands REF.

The refresh control circuit 230 may latch the internal address IADD as a first target address ADD_TREF1 according to the first target refresh command TREF1. The refresh control circuit 230 may latch the internal address IADD as an active address ADD_ACT according to the active command ACT, and randomly sample the active address ADD_ACT to store a plurality of sampling addresses ADD_SAMy. The refresh control circuit 230 may sequentially output the sampling addresses ADD_SAMy as the second target address ADD_TREF2 according to the second target refresh command TREF2, while masking a current sampling address and outputting a next sampling address as the second target address ADD_TREF2 when the first target address ADD_TREF1 is identical to the second target address ADD_TREF2. The refresh control circuit 230 may output a final target address TADD by selecting any of the first target address ADD_TREF1 and the second target address ADD_TREF2 according to the second target refresh command TREF2.

For reference, the sampling addresses SAM_ADDx generated by the first random sampling circuit 320 of the memory controller 100 may be defined as primary sampling addresses, and the sampling addresses ADD_SAMy generated by the second random sampling circuit 234 of the semiconductor memory device 200 may be defined as secondary sampling addresses.

In detail, the refresh control circuit 230 may include a first latch 231, a second latch 232, a second random sampling circuit 234, an output control circuit 236, and an address select circuit 238.

The first latch 231 may output the first target address ADD_TREF1 by latching the internal address IADD according to the first target refresh command TREF1. The second latch 232 may output the active address ADD_ACT by latching the internal address IADD according to the active command ACT.

The second random sampling circuit 234 may generate the sampling addresses ADD_SAMy by randomly sampling the active address ADD_ACT.

In detail, the second random sampling circuit 234 may include a second random signal generator 2342 and a third latch circuit 2344.

The second random signal generator 2342 may generate a second sampling signal SAM_EN2 that is randomly toggling or periodically toggling, based on the internal clock CLK. The second random signal generator 2342 may be implemented with a pseudo-random binary sequence (PRBS) based random pattern generator.

The third latch circuit 2344 may store the active address ADD_ACT as the sampling addresses ADD_SAMy, where y is a natural number from 0 to I, according to the second sampling signal SAM_EN2. For example, the third latch circuit 2344 may include a plurality of latches LAT30 to LAT3*i*, which may sequentially store the active address ADD_ACT as the sampling addresses ADD_SAMy whenever the second sampling signal SAM_EN2 is enabled.

The output control circuit 236 may sequentially output the sampling addresses ADD_SAMy as the second target address ADD_TREF2 according to the second target refresh command TREF2. The output control circuit 236 may mask the current sampling address and output the next sampling address as the second target address ADD_TREF2 when a hit signal HIT is enabled.

The address select circuit 238 may output the final target address TADD by selecting any of the first target address ADD_TREF1 and the second target address ADD_TREF2 according to the second target refresh command TREF2.

The address select circuit 238 may generate the hit signal HIT by comparing the first target address ADD_TREF1 with the second target address ADD_TREF2.

Referring to FIG. 12, the address select circuit 238 may include a selector 2382 and a comparator 2384.

The selector 2382 may output the final target address TADD by selecting any of the first target address ADD_TREF1 and the second target address ADD_TREF2 according to the second target refresh command TREF2. The comparator 2384 may compare the first target address ADD_TREF1 with the second target address ADD_TREF2, and enable the hit signal HIT when respective bits in the first target address ADD_TREF1 are identical to those in the second target address ADD_TREF2.

Referring back to FIG. 11, the row control circuit 212 may activate a word line WL corresponding to the internal address IADD according to the active command ACT, and precharge the activated word line WL according to the precharge command PCG. In order to select a word line to be refreshed during the normal refresh operation, a refresh counter (not shown) for generating a counting address that is sequentially increasing according to the normal refresh command REF may be additionally provided. The row control circuit 212 may perform the normal refresh operation of sequentially refreshing the plurality of word lines WL corresponding to the counting address according to the normal refresh command REF. The row control circuit 212 may perform the target refresh operation of refreshing one or more neighboring word lines of a word line WL corresponding to the final target address TADD according to the first target refresh command TREF1 or the second target refresh command TREF2.

Although it is not shown, the memory device 200 may further include a column control circuit for selecting bit lines corresponding to the column address among the internal address IADD, according to the read command RD or the write command WT. The memory device 200 may output data DQ read from the memory cell array 210 through the bit lines, under the control of the column control circuit, together with a data strobe signal DQS to the memory interface 150 of the memory controller 100.

As described above, the semiconductor memory device 200 may perform the target refresh operation on adjacent word lines corresponding to the first target address ADD_TREF1 in response to the first target refresh command TREF1, and perform the target refresh operation on adjacent word lines corresponding to the second target address ADD_TREF2, which is different from the first target address ADD_TREF1, in response to the second target refresh command TREF2. Thus, the memory system 10 in accordance with an embodiment may prevent unnecessary target refresh operations according to the same address, thereby improving refresh efficiency.

Further, the second random signal generator 2342 used in the memory device 200 may generate the random sampling signal on a different basis from the first random signal generator 322 used in the memory controller 100. Thus, the memory system 10 in accordance with an embodiment may compensate for the difficulties in randomization due to the periodicity of the sampling circuit by mixing sampling algorithms and further optimize the target refresh target selection.

Meanwhile, in various embodiments of the present invention, although it is described as an example that the first random signal generator 322 is composed of the LFSR based random pattern generator while the second random signal generator 2342 is composed of the PRBS based random pattern generator, the present invention is not limited thereto. According to an embodiment, the first random signal generator 322 may be implemented with any selected from the LFSR based or PRBS based random pattern generator, and the second random signal generator 2342 may be implemented with the other random pattern generator.

Hereinafter, referring to FIGS. 1 to 14, an operation of a memory system will be described.

Figure 13:
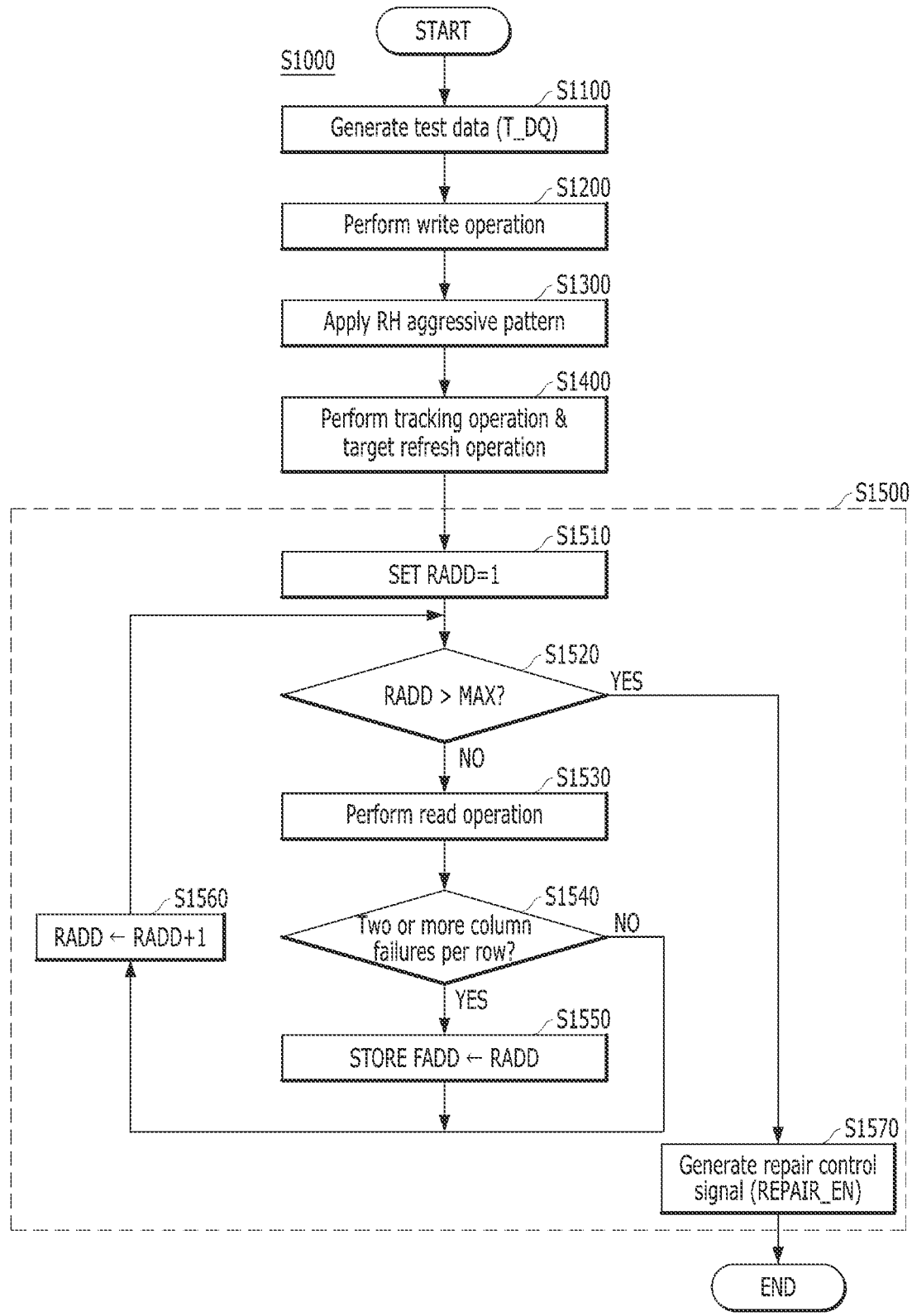
FIGS. 13 and 14 are flow charts for describing an operation of a memory system, in accordance with an embodiment of the present invention.

FIG. 13 is a flow chart for describing a test operation S1000 of a memory system in case where a tracking operation and a target refresh operation are performed when the no-tracking signal NO_TRACK is disabled, in accordance with an embodiment of the present invention.

Referring to FIG. 13, during the test operation, the BIST module 180 may generate the test command T_CMD and the test address T_ADDR according to the request TREQ inputted from the test device through the test interface 160, and generate the test data T_DQ corresponding to the test seed data TDATA (at S1100). The refresh control module 130 and the command/address generation module 140 may generate the command/address signal C/A based on the test command T_CMD and the test address T_ADDR provided from the arbitration circuit 122. The memory interface 150 may transmit the command/address signal C/A and the test data T_DQ to the memory device 200.

The memory device 200 may generate the internal command ICMD and the internal address IADD based on the command/address signal C/A, and perform a write operation for writing the test data T_DQ on memory cells corresponding to the internal address IADD (at S1200). For example, during the write operation, the memory device 200 may write all-high or all-zero data on the memory cells.

Thereafter, the BIST module 180 may apply a row hammer (R/H) aggressive pattern to the memory device 200 (at 51300). The R/H aggressive pattern may be generated by the data generation circuit 182 of the BIST module 180. The R/H aggressive may include a pattern in which hacking is simulated and a pattern in which different rows (i.e., word lines) at various positions in the memory cell array 210 are repeatedly randomly selected.

When the no-tracking signal NO_TRACK is disabled, the refresh control module 130 of the memory controller 100 may perform a target-address-generating operation to generate the first target address TREF1_ADD, and the memory device 200 may perform a target-address-generating operation to generate the second target address ADD_TREF2. Accordingly, the memory device 200 may perform a target refresh operation based on the first target address ADD_REF1 and the second target address ADD_TREF2 (at S1400). In detail, the memory controller 100 may generate the first target address TREF1_ADD with a high number of activations or high frequency of activations by sampling the active address ACT_ADD according to the active command ACT, and provide the first target address TREF1_ADD together with the first target refresh command TREF1. The memory device 200 may generate the second target address ADD_TREF2 by randomly sampling the active address ADD_ACT according to the active command ACT, and refresh adjacent word lines corresponding to the first target address ADD_REF1 according to the first target refresh command TREF1, and refresh adjacent word lines corresponding to the second target address ADD_TREF2, which is different from the first target address TREF1_ADD, in response to the second target refresh command TREF2.

Thereafter, the BIRA module 190 may generate the repair control signal REPAIR_EN by comparing the test data T_DQ generated by the BIST module 180 and the data DQ read from the semiconductor memory device 200 (at S1500).

In detail, the memory device 200 may set a row address RADD of the internal address IADD, to an initial value (e.g., "1") (at S1510), and perform a read operation for reading data DQ from memory cells disposed at a row corresponding to the row address RADD (at S1530). At this time, the memory device 200 may sequentially read out the data DQ by selecting one row address RADD while sequentially increasing a column address up to a maximum. The data analyzer 192 of the BIRA module 190 may detect a case in which two or more column failures (i.e., YI failure) occur per row, based on the data DQ sequentially read from the semiconductor memory device 200 (at S1540).

If two or more column failures occur per row ("YES" of S1540), the data analyzer 192 may enable the comparison signal COMP, and the address registers 194 may store the corresponding row address RADD as the fail address FADD (at S1550). On the contrary, if less than two column failures occur per row, or no column failures occur per row ("NO" of S1540), the data analyzer 192 may disable the comparison signal COMP, and the address registers 194 may not store the corresponding row address RADD. Then, the memory device 200 may increase the row address RADD by +1 (at S1560). The above operations from S1530 to S1560 may be repeatedly performed until the row address RADD reaches a maximum ("NO" of S1520).

For reference, in the embodiment of the present invention, it is determined that the probability of two or more column failures occurring in one row is very low in probability with a mechanism other than the R/H aggressive pattern, and the corresponding row address RADD may be stored as the fail address FADD. However, the proposed invention is not limited thereto, and when three or more column failures occur, the corresponding row address RADD may be stored as the fail address FADD.

When the row address RADD is full counted to reach the maximum ("YES" of S1520), the fail decision logic 196 may generate a counting value by counting the number of the fail addresses FADD stored in the address registers 194, and enable the repair enable signal REPAIR_EN or a chip-kill signal CHIP_KILL_EN according to the counting value. For example, the fail decision logic 196 may enable the chip-kill signal CHIP_KILL_EN when the counting value is greater than a threshold value, thereby discarding the corresponding memory device 200 not to be used. The fail decision logic 196 may enable the repair enable signal REPAIR_EN when the counting value is lower than or equal to the threshold value (at S1570). Accordingly, the command/address generation module 140 may determine whether to repair the address ADDR (e.g., the active address ACT_ADD) to generate the repair address REP_ADD, and output the repair address REP_ADD together with the command (e.g., the active command ACT), as the command/address signal C/A.

Figure 14:
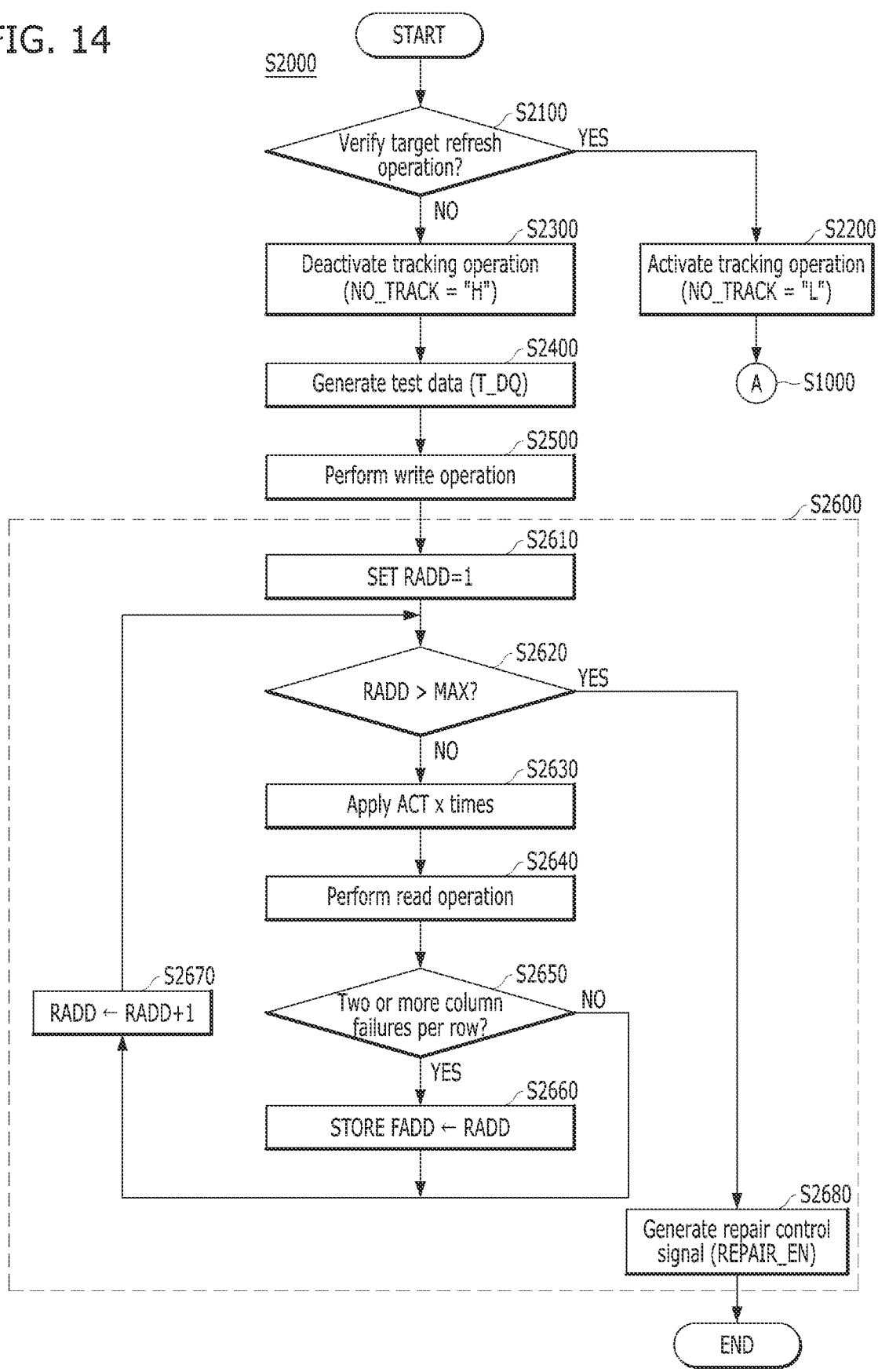

FIG. 14 is a flow chart for describing a test operation S2000 of a memory system according to the no-tracking signal NO_TRACK, in accordance with an embodiment of the present invention.

Referring to FIG. 14, in the case of detecting memory cells vulnerable to the row hammering while performing a target refresh operation ("YES" of S2100), the no-tracking signal NO_TRACK is disabled so that the tracking operation and the target refresh operation may be performed (at S2200). The test operation in case where the tracking operation and the target refresh operation are performed, may be substantially the same as the test operation S1000 of FIG. 13.

On the contrary, in the case of detecting memory cells vulnerable to the row hammering without performing a target refresh operation ("NO" of S2100), the no-tracking signal NO_TRACK is enabled so that the tracking operation and the target refresh operation may be stopped (at S2300).

The BIST module 180 may generate the test command T_CMD and the test address T_ADDR according to the request TREQ inputted from the test device through the test interface 160, and generate the test data T_DQ corresponding to the test seed data TDATA (at S2400). The refresh control module 130 and the command/address generation module 140 may generate the command/address signal C/A based on the test command T_CMD and the test address T_ADDR provided from the arbitration circuit 122. The memory interface 150 may transmit the command/address signal C/A and the test data T_DQ to the memory device 200.

The memory device 200 may generate the internal command ICMD and the internal address IADD based on the command/address signal C/A, and perform a write operation for writing the test data T_DQ on memory cells corresponding to the internal address IADD (at S2500). For example, during the write operation, the memory device 200 may write all-high or all-zero data on the memory cells.

Thereafter, the BIRA module 190 may generate the repair control signal REPAIR_EN by comparing the test data T_DQ generated by the BIST module 180 and the data DQ read from the semiconductor memory device 200 (at S2600).

In detail, the memory device 200 may set a row address RADD of the internal address IADD, to an initial value (e.g., "1") (at S2610). The BIST module 180 may generate the test command T_CMD and the test address T_ADDR according to the request TREQ so as to apply the active command ACT several times (x times) to a row corresponding to the row address RADD. The command/address generation module 140 may generate the command/address signal C/A based on the test command T_CMD and the test address T_ADDR provided from the arbitration circuit 122. According to the command/address signal C/A, the memory device 200 may perform an active operation on the corresponding row x times (at S2630). As a result, the row hammering phenomenon may occur in memory cells connected to the corresponding row.

Thereafter, the memory device 200 may perform a read operation for reading data DQ from memory cells disposed at the corresponding row (at S2640). At this time, the memory device 200 may sequentially read out the data DQ by selecting one row address RADD while sequentially increasing a column address up to maximum. The data analyzer 192 of the BIRA module 190 may detect a case in which two or more column failures occur per row, based on the data DQ sequentially read from the semiconductor memory device 200 (at S2650).

If two or more column failures occur per row ("YES" of S2650), the data analyzer 192 may enable the comparison signal COMP, and the address registers 194 may store the corresponding row address RADD as the fail address FADD (at S2660). On the contrary, if less than two column failure occurs per row, or no column failures occur per row ("NO" of S2650), the data analyzer 192 may disable the comparison signal COMP, and the address registers 194 may not store the corresponding row address RADD. Then, the memory device 200 may increase the row address RADD by +1 (at S2670). The above operations from S2630 to S2670 may be repeatedly performed until the row address RADD reaches a maximum ("NO" of S2620).

When the row address RADD is fully counted to reach the maximum ("YES" of S2620), the fail decision logic 196 may generate a counting value by counting the number of the fail addresses FADD stored in the address registers 194, and enable the repair enable signal REPAIR_EN or a chip-kill signal CHIP_KILL_EN according to the counting value. For example, the fail decision logic 196 may enable the chip-kill signal CHIP_KILL_EN when the counting value is greater than a threshold value, thereby discarding the corresponding memory device 200 not to be used. The fail decision logic 196 may enable the repair enable signal REPAIR_EN when the counting value is lower than or equal to the threshold value (at S2680). Accordingly, the command/address generation module 140 may determine whether to repair the address ADDR (e.g., the active address ACT_ADD) to generate the repair address REP_ADD, and output the repair address REP_ADD together with the command (e.g., the active command ACT), as the command/address signal C/A.

Various embodiments of the present disclosure have been described in the drawings and specification. Although specific terminologies are used here, the terminologies are only to describe the embodiments of the present disclosure. Therefore, the present disclosure is not restricted to the above-described embodiments and many variations are possible within the spirit and scope of the present disclosure. It should be apparent to those skilled in the art that various modifications can be made on the basis of the technological scope of the present disclosure in addition to the embodiments disclosed herein. The embodiments may be combined to form additional embodiments It should be noted that although the technical spirit of the disclosure has been described in connection with embodiments thereof, this is merely for description purposes and should not be interpreted as limiting. It should be appreciated by one of ordinary skill in the art that various changes may be made thereto without departing from the technical spirit of the disclosure and the following claims.

For example, for the logic gates and transistors provided as examples in the above-described embodiments, different positions and types may be implemented depending on the polarity of the input signal.

What is claimed is:
1. A memory controller, comprising:
a test circuit suitable for generating a test command, a test address, and test data during a test operation;
a refresh control circuit suitable for receiving the test command and the test address as an active command and an active address, and generating a first target address based on a priority address generated by counting a number of inputs of a partial address corresponding to some bits of the active address and a plurality of primary sampling addresses generated by sampling the active address according to the active command, during the test operation;
a command/address generator suitable for providing the active address together with the active command, and providing a first target refresh command together with the first target address to a memory device, while determining whether to repair the active address according to a repair control signal; and a repair analysis circuit suitable for generating the repair control signal based on a comparison result of the test data and read data from the memory device, during the test operation.

2. The memory controller of claim 1, wherein the repair analysis circuit includes:
a data analyzer suitable for generating a comparison signal by comparing the test data with the read data in response to a test mode signal;
a plurality of address registers suitable for sequentially storing the active address as a plurality of fail addresses when the comparison signal is enabled; and
a fail decision logic suitable for generating a counting value by counting a number of the fail addresses to enable the repair enable signal according to the counting value.

3. The memory controller of claim 2,
wherein the memory device sequentially outputs the read data by sequentially increasing a column address while selecting a row address, and
wherein the data analyzer enables the comparison signal by detecting a case in which two or more column failures occur per row based on the read data.

4. The memory controller of claim 2
wherein the fail decision logic enables a chip-kill signal for notifying discarding of the memory device not to be used, when the counting value is greater than a threshold value, and
wherein the fail decision logic enables the repair enable signal when the counting value is lower than or equal to the threshold value.

5. The memory controller of claim 2, wherein the command/address generator includes:
a repair control circuit suitable for comparing the active address with the fail addresses stored in the plurality of address registers in response to the repair enable signal, and outputting a repair address by re-mapping the active address to a redundancy address according to a comparison result; and
a command/address generation circuit suitable for providing the repair address together with the active command, and providing the first target refresh command together with the first target address, to the memory device.

6. The memory controller of claim 1, further comprising:
a test interface suitable for receiving a request and test seed data from a test device during the test operation,
wherein the test circuit includes:
a data generation circuit suitable for generating the test data corresponding to the test seed data;
an address generation circuit suitable for generating the test address corresponding to the request; and
a command generation circuit suitable for generating the test command corresponding to the request.

7. The memory controller of claim 1, wherein the refresh control circuit includes:
a partial sampling circuit suitable for storing some bits of the active address as the partial address according to the active command, and setting the priority address by counting the number of inputs of the partial address;
a first random sampling circuit suitable for generating a plurality of primary sampling addresses by randomly sampling the active address; and
a target address generation circuit suitable for outputting any of the primary sampling addresses, which is identical to the priority address, as the first target address, in response to the first target refresh command.

8. The memory controller of claim 7, wherein the partial sampling circuit includes:
a first latch circuit including a plurality of latches each of which exclusively stores some bits of the active address as its own partial address in response to the active command;
an address counter suitable for generating a plurality of counting values by counting a number of inputs of an identical partial address into each of the latches during each cycle of the issue of the first target refresh command; and
a comparison analyzer suitable for determining a priority by comparing the counting values, and storing the partial address stored in the latches, into a plurality of priority address storages according to the priority, wherein the priority address is outputted from a priority address storage with the highest priority among the priority address storages.

9. The memory controller of claim 7, wherein the first random sampling circuit includes:
a first random signal generator suitable for generating a first sampling signal that is randomly enabled; and
a second latch circuit suitable for sequentially storing the active address as the primary sampling addresses into a plurality of latches according to the first sampling signal.

10. The memory controller of claim 7, wherein the target address generation circuit includes:
a plurality of comparison output circuits respectively corresponding to the primary sampling addresses, wherein each of the comparison output circuits outputs a corresponding sampling address of the primary sampling addresses by comparing the corresponding sampling address with the priority address; and
a buffer circuit suitable for outputting the primary sampling addresses outputted from the comparison output circuits, as the first target address, in response to the first target refresh command.

11. A memory system, comprising:
a memory controller suitable for providing a first target refresh command with a first target address; and
a memory device suitable for performing a target refresh operation on at least one word line corresponding to the first target address according to the first target refresh command, while performing the target refresh operation on at least one word line corresponding to a second target address, which is different from the first target address, according to a second target refresh command,
wherein the memory controller includes:
a test circuit suitable for generating a test command, a test address, and test data during a test operation;
a refresh control circuit suitable for receiving the test command and the test address as an active command and an active address, and generating a first target address based on a priority address generated by counting a number of inputs of a partial address corresponding to some bits of the active address and a plurality of primary sampling addresses generated by sampling the active address, during the test operation;
a command/address generator suitable for providing the active address together with the active command, and providing the first target refresh command together with the first target address, while determining whether to repair the active address according to a repair control signal; and a repair analysis circuit suitable for generating the repair control signal based on a comparison result of the test data and read data from the memory device, during the test operation.

12. The memory system of claim 11, wherein the memory device includes:
a refresh control circuit suitable for generating the second target address by sampling the active address according to the active command,
wherein the refresh control circuit generates the second target address based on a plurality of secondary sampling addresses generated by randomly sampling the active address.

13. The memory system of claim 11, wherein the repair analysis circuit includes:
a data analyzer suitable for generating a comparison signal by comparing the test data with the read data in response to a test mode signal
a plurality of address registers suitable for sequentially storing the active address as a plurality of fail addresses when the comparison signal is enabled; and
a fail decision logic suitable for generating a counting value by counting a number of the fail addresses to enable the repair enable signal according to the counting value.

14. The memory system of claim 13,
wherein the memory device sequentially outputs the read data by sequentially increasing a column address while selecting a row address, and
wherein the data analyzer enables the comparison signal by detecting a case in which two or more column failures occur per row based on the read data.

15. The memory system of claim 13,
wherein the fail decision logic enables a chip-kill signal for notifying discarding of the memory device not to be used, when the counting value is greater than a threshold value, and
wherein the fail decision logic enables the repair enable signal when the counting value is lower than or equal to the threshold value.

16. The memory system of claim 13, wherein the command/address generator includes:
a repair control circuit suitable for comparing the active address with the fail addresses stored in the address registers in response to the repair enable signal, and outputting a repair address by re-mapping the active address to a redundancy address according to a comparison result; and
a command/address generation circuit suitable for providing the repair address together with the active command, and providing the first target refresh command together with the first target address, to the memory device.

17. The memory system of claim 11, further comprising:
a test interface suitable for receiving a request and test seed data from a test device during the test operation,
wherein the test circuit includes:
a data generation circuit suitable for generating the test data corresponding to the test seed data;
an address generation circuit suitable for generating the test address corresponding to the request; and
a command generation circuit suitable for generating the test command corresponding to the request.

18. An operation method of a memory system, comprising:

writing test data on a memory cell array of the memory device;
applying an aggressive pattern to the memory device;
generating a first target address based on a priority address generated by counting a number of inputs of a partial address corresponding to some bits of an active address and a plurality of primary sampling addresses generated by sampling the active address according to an active command, and performing a target refresh operation of the memory device based on the first target address;
generating a repair control signal based on a comparison result of the test data and read data from the memory device; and
repairing the active address according to the repair control signal.

19. The operation method of claim 18, wherein the generating a first target address includes:
storing the some bits of the active address as the partial address according to the active command, and setting the priority address by counting the number of inputs of the partial address;
generating a plurality of primary sampling addresses by randomly sampling the active address; and
outputting any of the primary sampling addresses, which are identical to the priority address, as the first target address, in response to a first target refresh command.

20. The operation method of claim 18, wherein the performing a target refresh operation of the memory device includes:
generating, at the memory device, a second target address by sampling the active address according to the active command; and
performing, at the memory device, the target refresh operation on at least one word line corresponding to the first target address according to a first target refresh command, and performing the target refresh operation on at least one word line corresponding to the second target address, which is different from the first target address, according to a second target refresh command.

21. The operation method of claim 18, wherein the generating a repair control signal includes:
generating a comparison signal by comparing the test data with the read data in response to a test mode signal;
sequentially storing the active address as a plurality of fail addresses when the comparison signal is enabled; and
generating a counting value by counting a number of the fail addresses to enable the repair enable signal according to the counting value.

22. The operation method of claim 21, wherein the generating a comparison signal includes:
enabling the comparison signal by detecting a case in which two or more column failures occur per row based on the read data sequentially outputted from the memory device by sequentially increasing a column address while selecting a row address.

23. The operation method of claim 21, wherein the enabling the repair enable signal includes:
enabling a chip-kill signal for notifying discarding of the memory device not to be used, when the counting value is greater than a threshold value, and
enabling the repair enable signal when the counting value is lower than or equal to the threshold value.

* * * * *